United States Patent [19]

Anazawa et al.

[11] Patent Number: 5,693,966
[45] Date of Patent: Dec. 2, 1997

[54] POWER MOS TRANSISTOR

[75] Inventors: Takeo Anazawa, Sendai; Hidetaka Fukazawa, Miyagi, both of Japan

[73] Assignee: Motorola, Inc., Schaumburg, Ill.

[21] Appl. No.: 585,992

[22] Filed: Jan. 16, 1996

[30] Foreign Application Priority Data

Jan. 27, 1995 [JP] Japan .................. 7-011317

[51] Int. Cl.$^6$ .................................. H01L 27/10
[52] U.S. Cl. .................. 257/207; 257/208; 257/211; 257/401; 257/412; 257/413
[58] Field of Search .................. 257/413, 412, 257/401, 202, 207, 208, 211

[56] References Cited

U.S. PATENT DOCUMENTS 5,256,894  10/1993  Shino ................... 257/413 X
5,341,014  8/1994   Fujii et al. ............ 257/413 X
5,486,715  1/1996   Zommer ................. 257/413 X

*Primary Examiner*—William Mintel
*Attorney, Agent, or Firm*—Sharon K. Coleman

[57] ABSTRACT

Propagation delay times of an input signal from an input terminal to respective gates are equalized and accelerated with a power MOS transistor that includes a plurality of transistor blocks. The transistor blocks are formed by sources being connected to each other by a first electric conductive layer ($8_2$, $8_4$, $8_6$ and 10), drains being connected to each other by a second electric conductive layer ($8_1$, $8_3$, $8_5$ and 9), and gates (6) consisting of a continuous semiconductor layer. The transistor has a third electric conductive layer (11) being connected to a gate terminal Gin and laminated on the gates. The third electric conductive layer laminated on the gates functions to equalize and accelerate propagation delay times of an input signal from an input terminal to the respective gates. By extending that conductive layer to near the center of a principal plane of the gate, the delay time of a gate input signal to the transistor block located at the center of the semiconductor chip can be reduced substantially.

20 Claims, 13 Drawing Sheets

(A)

(B)

POWER MOS TRANSISTOR

FIELD OF THE INVENTION

The present invention relates to a MOS field effect transistor (MOS-FET). In particular, the present invention relates to a power transistor supplying a large current to an output terminal thereof. The present invention furthermore relates to a transistor for driving a relatively heavy load, and more specifically, to a transistor for driving an inductive load including motors while switching.

BACKGROUND OF THE INVENTION

FIG. 1 shows an example where a plurality of MOS transistor blocks are formed on a semiconductor chip, and connected together to form a single power integrated circuit (IC).

In FIG. 1, MOS transistors $Q_1$–$Q_n$, which are transistor blocks, are connected in parallel to each other, wherein the gates of the transistors, which are connected to each other, the drains thereof, which are connected to each other, and the sources thereof, which are connected to each other, are led to a terminal G, a terminal D, and a terminal C, respectively. The power IC 1 so configured has a power supply connected to the terminal D and a motor 2 connected to the terminal S; when an input signal having a level for turning on the transistors $Q_1$–$Q_n$ is supplied to the terminal G, each transistor is turned on, so the power supply current from the terminal D is fed through each transistor to the terminal S. The current fed to the terminal S is then supplied as a motor drive current to the motor 2.

The connection between the transistor blocks in this power IC 1 may be generally explained in a semiconductor chip by way of a schematic diagram, as shown in FIG. 2.

In FIG. 2, for each transistor block, a source s and a drain d are formed on a semiconductor substrate 11, and a gate g, which comprises polysilicon, is further laminated thereon via a silicon oxide film and so on. If single-layer aluminum wiring process is used for the entire connection throughout the transistor blocks formed on the semiconductor substrate 11, aluminum is used for wiring between the sources and between the drains in two adjacent transistor blocks as shown, such as $Q_m$ and $Q_{m+1}$, whereas the same (or common) polysilicon as that of the gates is used for wiring between the gates.

However, because polysilicon used for gate wiring has a substantially greater resistivity than aluminum, it takes considerable time to propagate an input signal from the terminal G to gates located farther away, compared to gates located relatively near the terminal G on the chip. Thus, the farther away the transistor blocks are from the terminal G on the chip, the longer the time required for the input signal to switch to on or off in response to a level change. By way of example a power IC with a transistor block having a gate width of 10,000 µm or greater, the switching speed drops considerably when outputting a motor drive current having a heavy load of, for example, 1A.

Thus, it is a purpose of the present invention to provide a MOS transistor that equalizes and accelerates propagation delay times of an input signal from an input terminal to the respective gates.

SUMMARY OF THE INVENTION

The MOS transistor according to the present invention includes a plurality of transistor blocks formed by sources which are connected to each other by a first electric conductive layer, drains which are connected to each other by a second electric conductive layer, and gates made of a continuous semiconductor layer, the improvement comprising a third electric conductive layer which is connected to a gate terminal and laminated on said gates.

According to the MOS transistor of the present invention, the conductive layer laminated on the gates formed of a continuous semiconductor layer propagates an input signal to the gate of each transistor block with relatively little delay.

DESCRIPTION OF THE PREFERRED EMBODIMENT

The present invention will be described in detail below with reference to the accompanying drawings.

Figure 3:
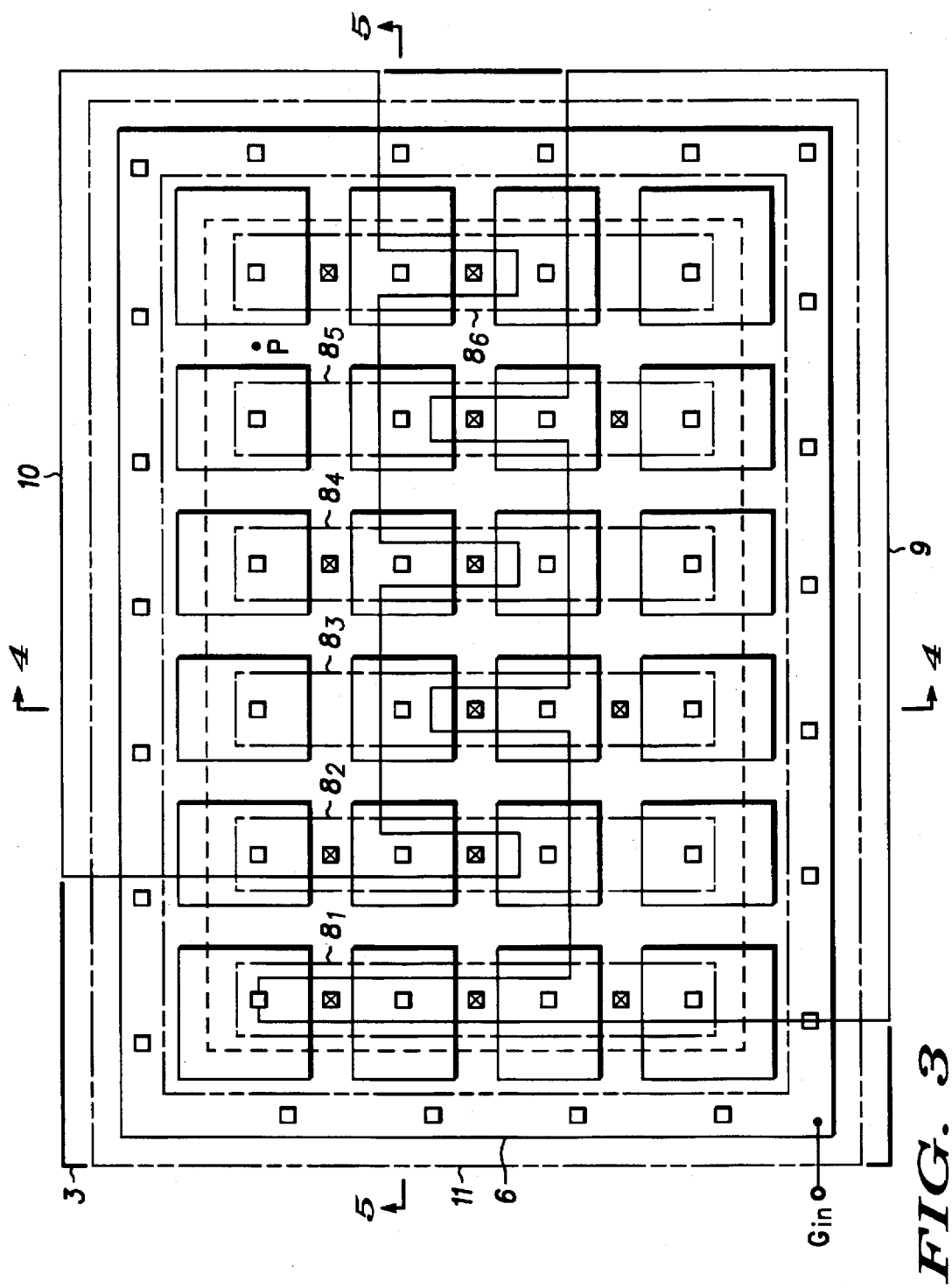
FIG. 3 is a plan perspective view depicting the structure of a MOS transistor according to one (first) embodiment of the present invention.
Figure 4:
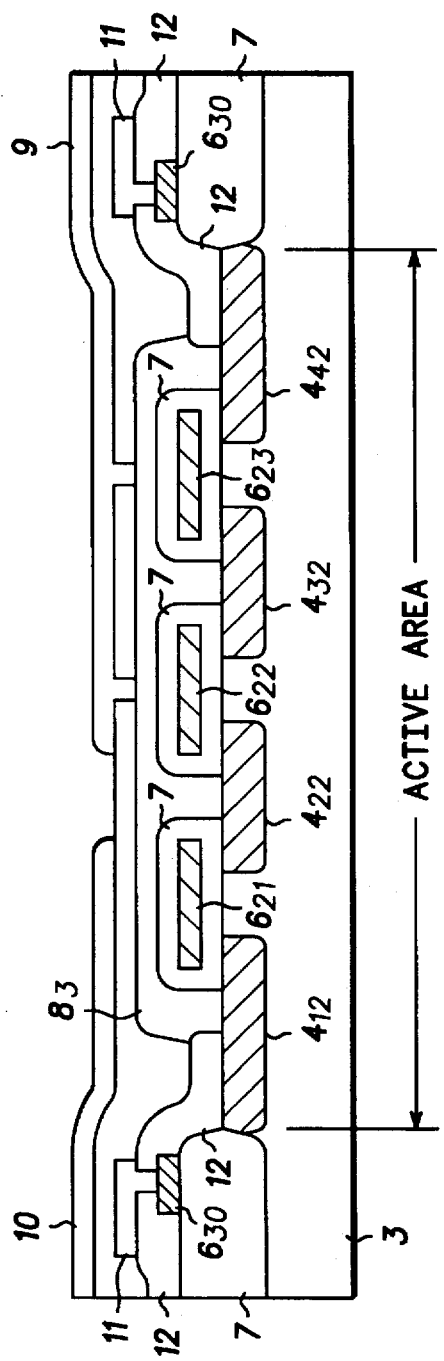
FIG. 4 is a cross-sectional view along 4—4 of the MOS transistor of FIG. 3.
Figure 5:
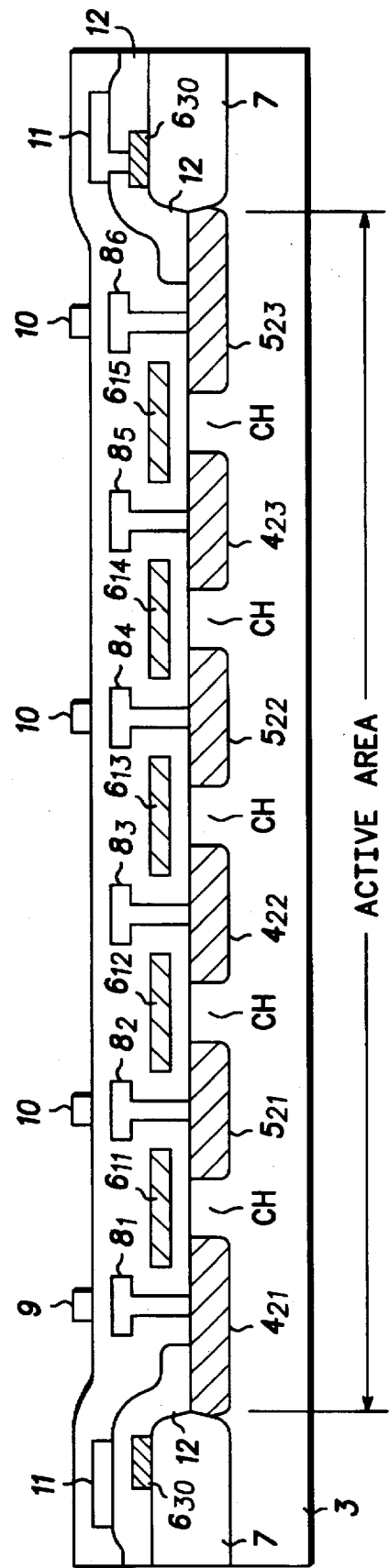
FIG. 5 is a cross-sectional view along 5—5 of the MOS transistor of FIG. 3.
Figure 6:
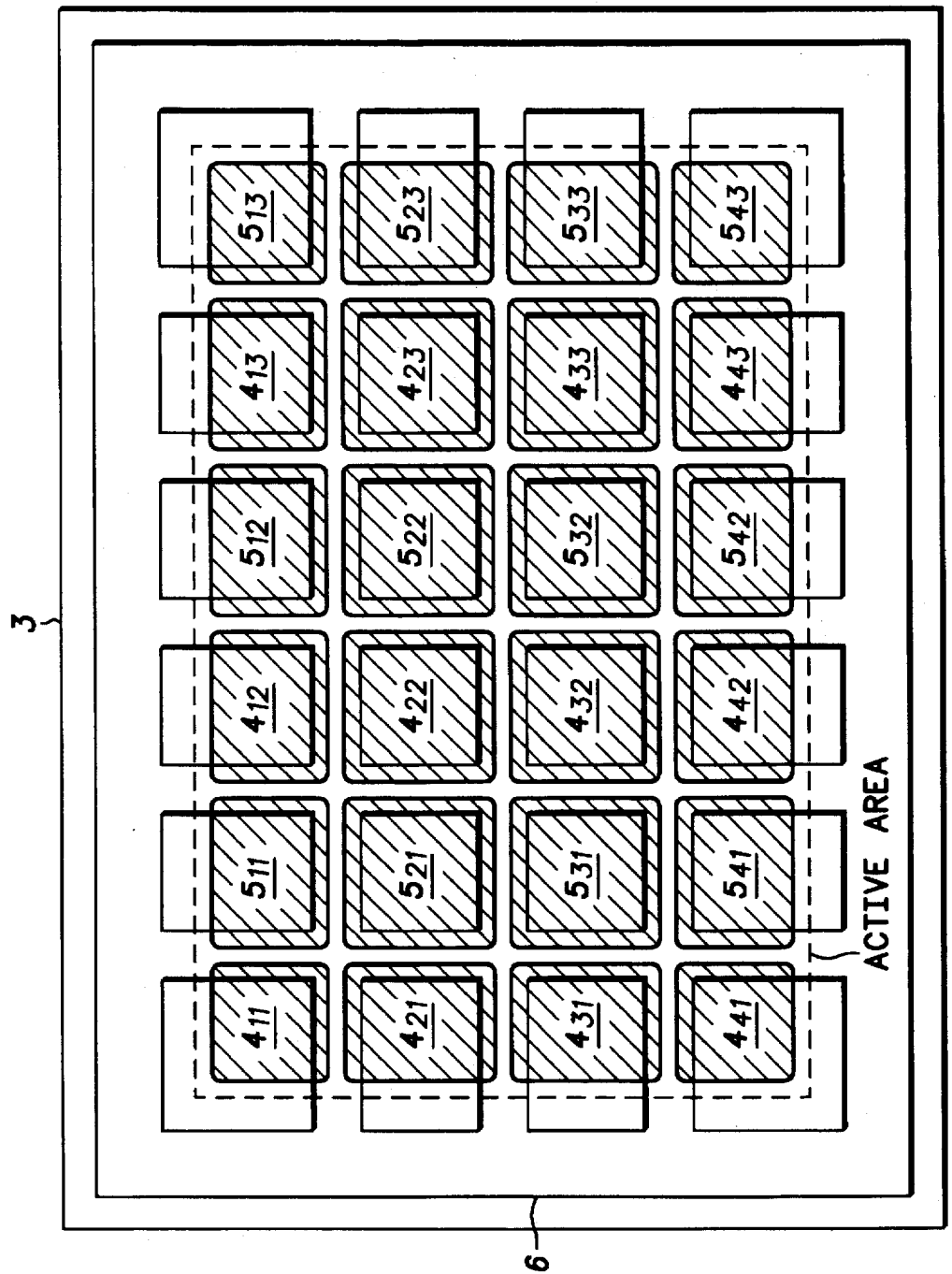
FIG. 6 is a partial perspective view depicting the arrangement of the drain and source in the MOS transistor of FIG. 3.
Figure 7:
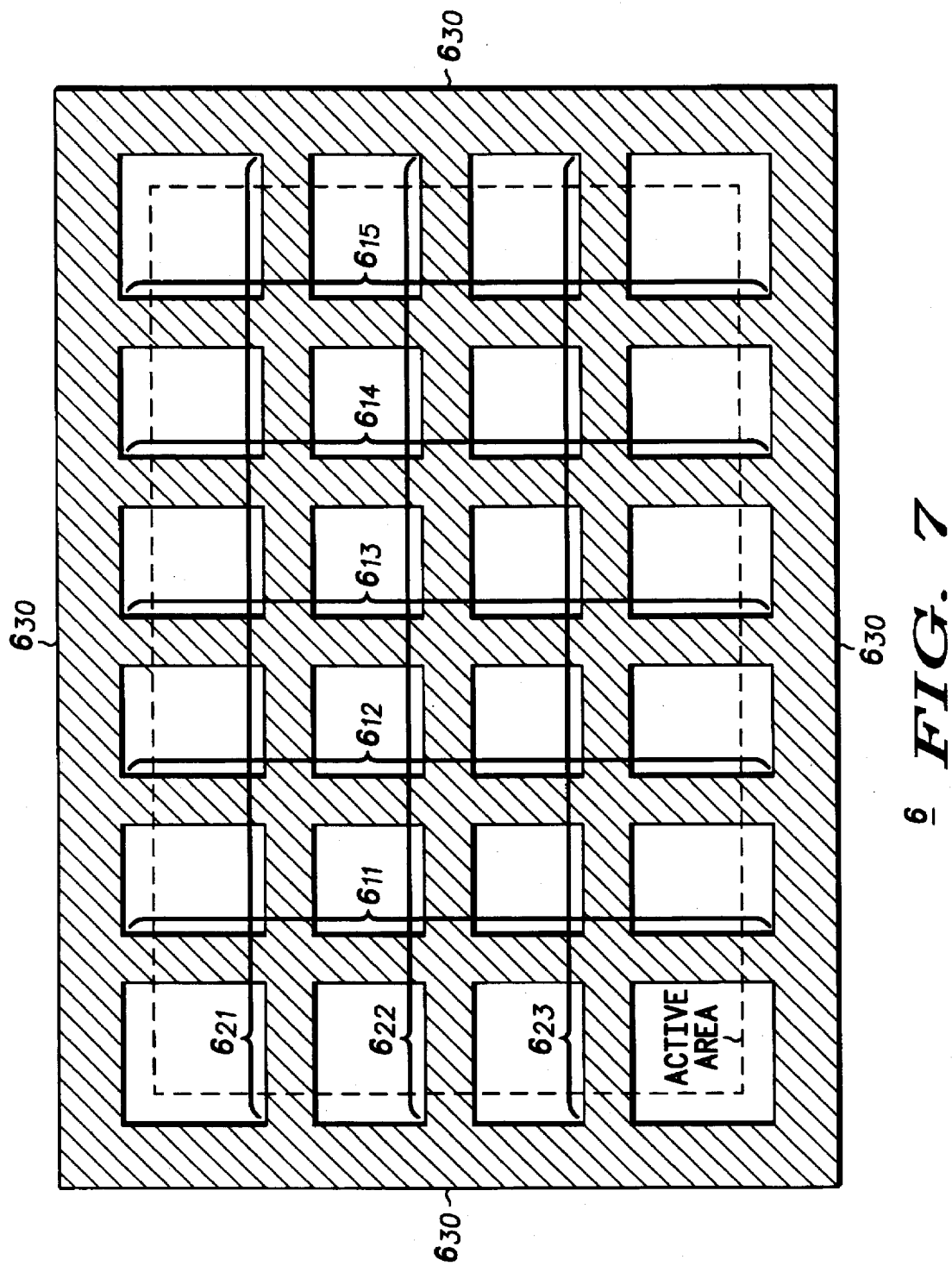
FIG. 7 is a partial perspective view depicting the shape of the gate in the MOS transistor of FIG. 3.
Figure 8:
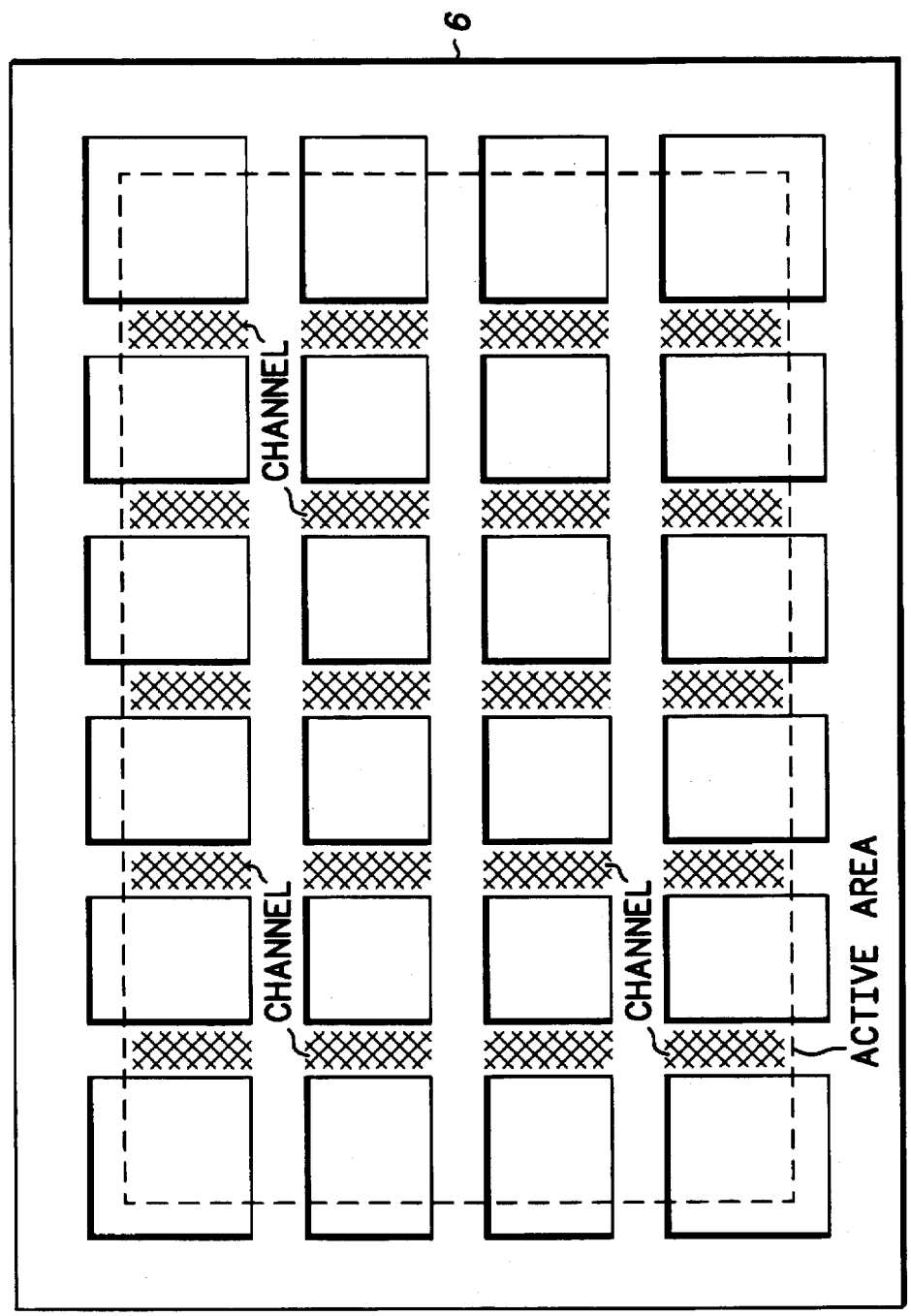
FIG. 8 is a partial perspective view depicting the channel formed in the MOS transistor of FIG. 3.

FIG. 3 is a plan perspective view depicting the structure of a MOS transistor according to one embodiment of the present invention; FIG. 4 is a cross-sectional view along 4—4 of FIG. 3; and FIG. 5 is a cross-sectional view along 5—5 of FIG. 5. FIGS. 6–8 are partial perspective views of FIG. 3.

In FIGS. 3–8, a plurality of drains and corresponding sources formed by diffusion are disposed in a semiconductor substrate 3 (which is represented by a thick solid line) formed of p-type polysilicon. Referring more specifically to the arrangement of these drains and sources, the drain and source regions extending in the vertical direction are arranged alternatively in the horizontal direction on the semiconductor chip 3, as shown in FIG. 6. The drains $4_{11}$–$4_{41}$, $4_{12}$–$4_{42}$, and $4_{13}$–$4_{43}$ are arranged vertically in the first, second, and third drain regions, respectively. Likewise, the sources $5_{11}$–$5_{41}$, $5_{12}$–$5_{42}$, and $5_{13}$–$5_{43}$ are arranged vertically in the first, second, and third source regions, respectively.

A gate 6 (which is represented by a thin solid line) formed of, for example, polysilicon, is laminated through an oxide film 7, such as $SiO_2$, between the sources, between the drains, and between the source and drain. That is, as shown in FIG. 7, the gate 6 takes a grid-like shape, such that it covers gaps between the drains and sources, as viewed from the front. In other words, the gate 6 has vertically extending portions $6_{11}$–$6_{15}$ and horizontally extending portions $6_{21}$–$6_{23}$ along a principal plane of the semiconductor substrate 3. Thus, on the semiconductor substrate 3, the sources $4_{11}$–$4_{43}$ and drains $5_{11}$–$5_{43}$ are formed in regions (first through third drain and source regions) separated by the vertically extending portions $6_{11}$–$6_{15}$ of the gate 6, which are laminated through the oxide film 7 between the sources and drains. Furthermore, the gate 6 has a surrounding portion $6_{30}$ that couples the vertically and horizontally extending portions to each other.

With the drains, sources, and gates so arranged, channels, generally denoted by shaded areas in FIG. 8, are formed on the semiconductor substrate 3. Such channels are also represented by reference symbol "CH" in FIG. 5. In FIG. 8, 20 channels are formed on the semiconductor substrate, indicating that 20 transistor blocks are formed.

The drains and sources are connected by one-direction connecting portions (layers) $8_1$–$8_6$, which are conductors, such as aluminum, as denoted by a thin alternate long and short dash line, for each region. More specifically, the drains $4_{11}$–$4_{41}$, sources $5_{11}$–$5_{41}$, drains $4_{12}$–$4_{42}$, sources $5_{12}$–$5_{42}$, drain $4_{13}$–$4_{43}$, and sources $5_{13}$–$5_{43}$ are connected to each other by the connecting portion $8_2$, $8_3$, $8_4$, $8_5$, and $8_6$, respectively. A contact hole, which is a node between the one-direction connecting portion and the drain and source is represented by mark "■" in FIG. 3. Furthermore, of these one-direction connecting portions, there are provided an other-direction connecting portion 9 for commonly connecting the one-direction connecting portions $8_1$, $8_3$, and $8_5$ connected to the drains, and an other-direction connecting portion 10 for commonly connecting the one-direction connecting portions $8_2$, $8_4$, and $8_6$ connected to the sources. These other-direction connecting portions, which are represented by a thick alternate long and short dash line in the figures, are also formed of a conductor such as aluminum. Nodes between the other-direction connecting portions 9 and 10 and the one-direction connecting portions, i.e., so-called "via holes", are denoted by "□" overlapped by "x".

By such one-direction and other-direction connecting portions, common connections for all the drains and sources formed on the semiconductor substrate 3 are achieved.

On the surrounding portion $6_{30}$ of the gate 6, a conductor 11 such as aluminum, which is denoted by a thin alternate long and two short dashes line, is laminated in contact therewith, and one end of the conductor 11 and the gate terminal of the overall MOS transistor are connected together. A node between the conductor 11 and gate 6, i.e., a contact hole, is also represented by "■" in FIG. 3. In addition, an insulating film 12 is formed around the contact hole of the conductor 11.

The signal propagation time for the gate 6 is reduced by the conductor 11 disposed on the gate 6. In FIG. 3, for example, the propagation of the input signal from a terminal Gin located at one corner of the rectangular conductor 11 to a point P on the gate is achieved fast enough to practically ignore the resistance because the conductor 11 extends to reach around the point P, so that the transistor blocks containing the point P provide quite good response to the input signal. On the other hand, with a prior art configuration where the conductor 11 that extends around the point P is absent, only the propagation through polysilicon of the gate 6 is effective, so such responsiveness as offered by the present invention could not be achieved.

Additionally, the MOS transistor of the present embodiment can be fabricated with reasonable efficiency, by fabricating the conductors $8_1$–$8_6$ for connecting the drains and source in one direction, and the gate-laminated conductor 11 at a single-layer aluminum wiring process step, and fabricating the conductors 9 and 10 for connecting the drains and sources in the other direction at a second-layer aluminum wiring process step. On the other hand, all the conductors may be formed at a single-layer wiring process step, depending on how well the layout is done on the semiconductor substrate. This may increase the entire area of the semiconductor chip required for the layout or require more precise micro-machining technology, as compared to a two-layer aluminum wiring process.

In the above embodiment, the structure has been described where the conductor 11 is laminated only around the surrounding portion 630 of the gate 6, although the conductor may also be laminated near some of the vertically and horizontally extending portions of the grid-shaped gate.

Figure 9:
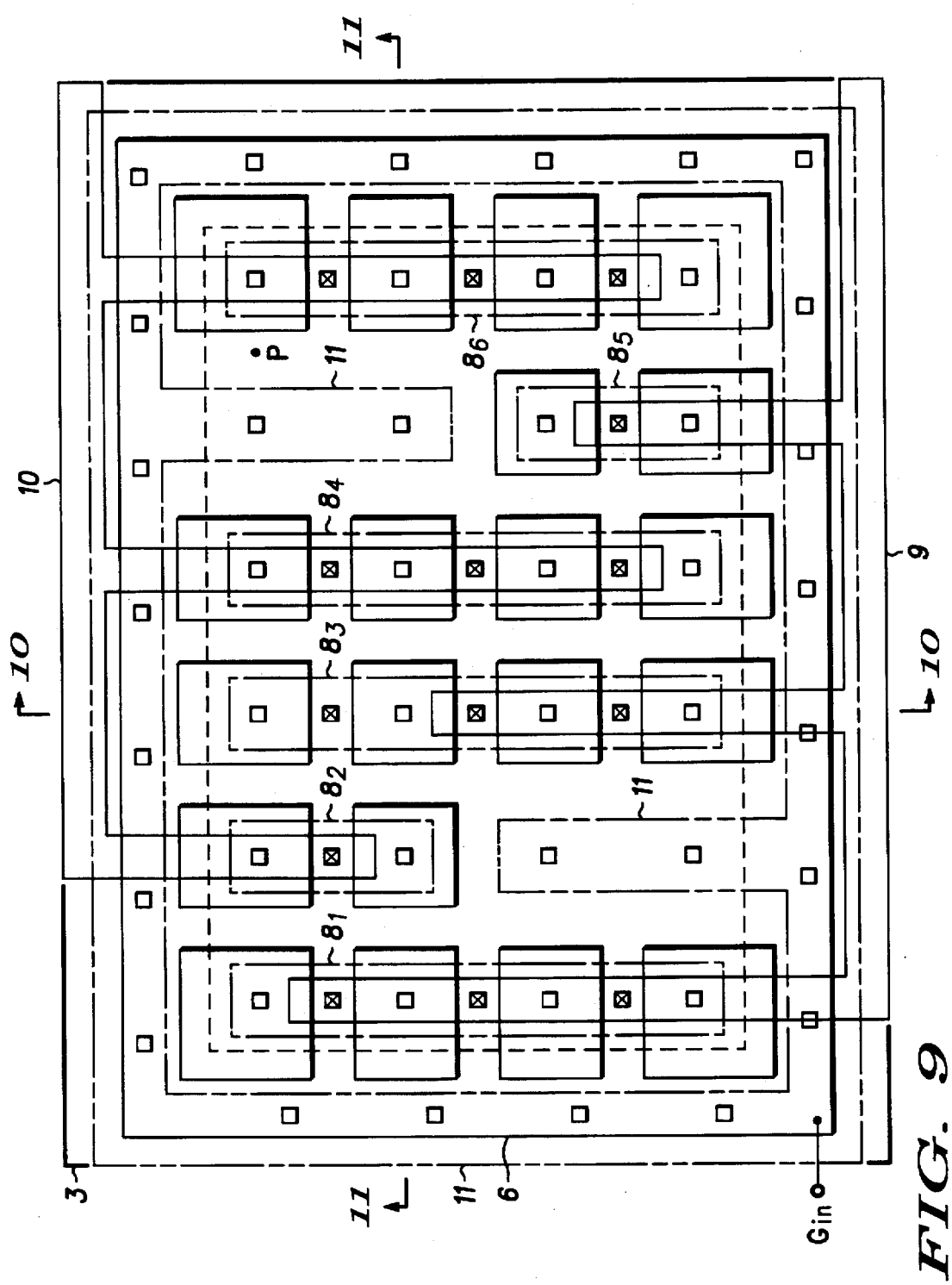
FIG. 9 is a plan perspective view depicting the structure of a MOS transistor according to another (second) embodiment of the present invention.
Figure 10:
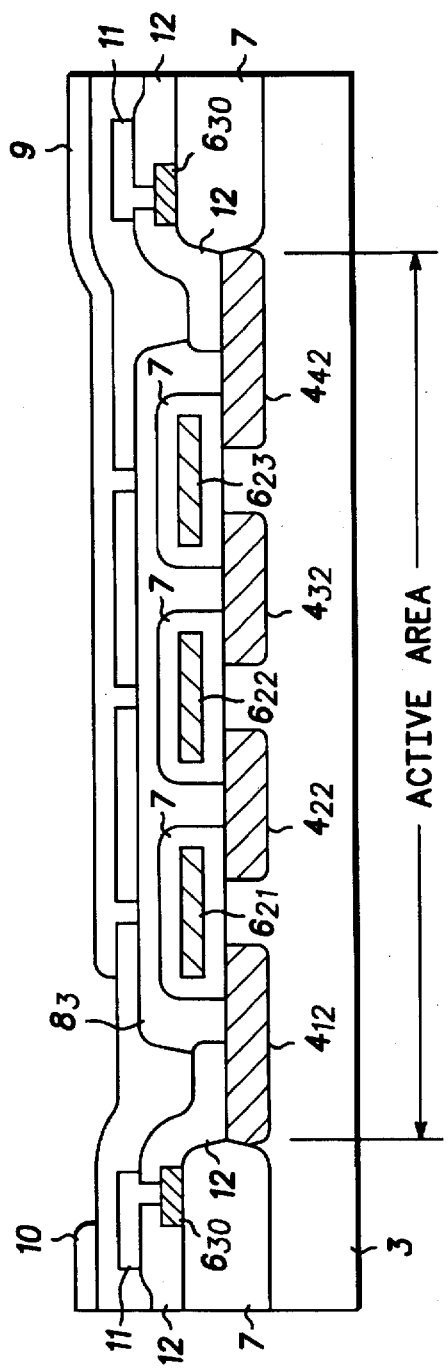
FIG. 10 is a cross-sectional view along 10—10 of the MOS transistor of FIG. 9.
Figure 11:
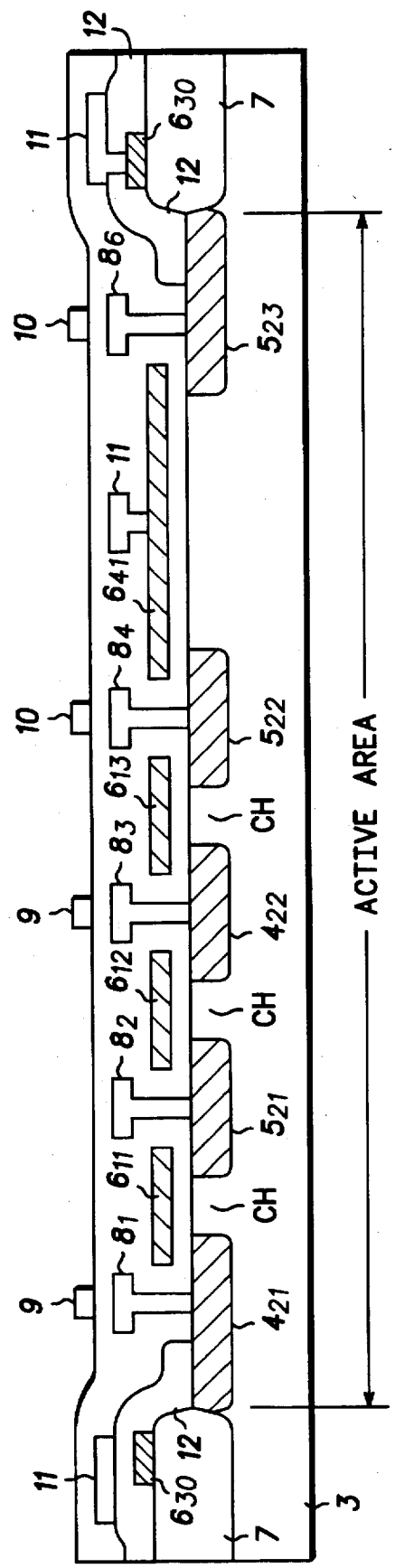
FIG. 11 is a cross-sectional view along 11—11 of the MOS transistor of FIG. 9.
Figure 12:
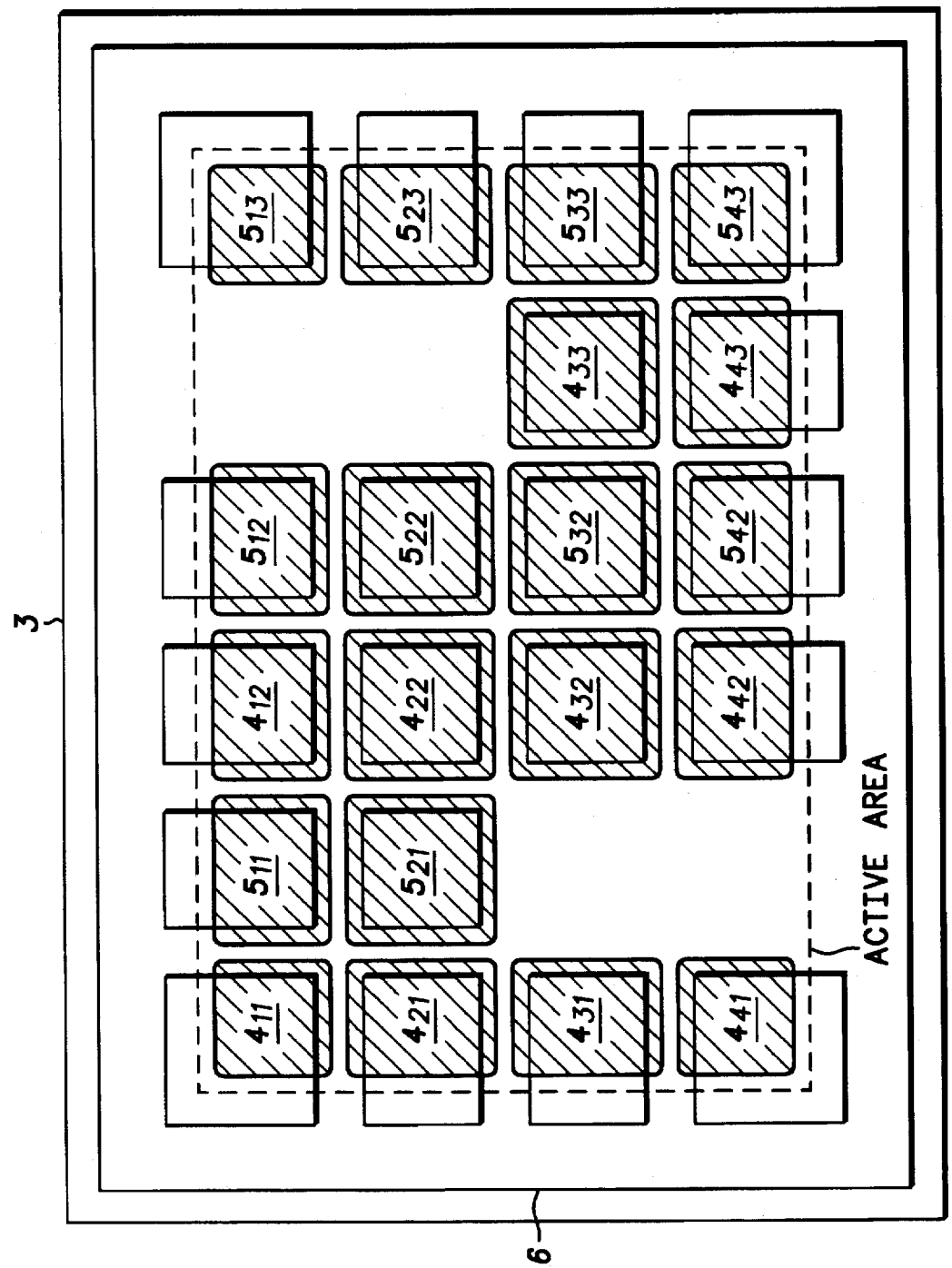
FIG. 12 is a partial perspective view depicting the arrangement of the drain and source in the MOS transistor of FIG. 9.
Figure 13:
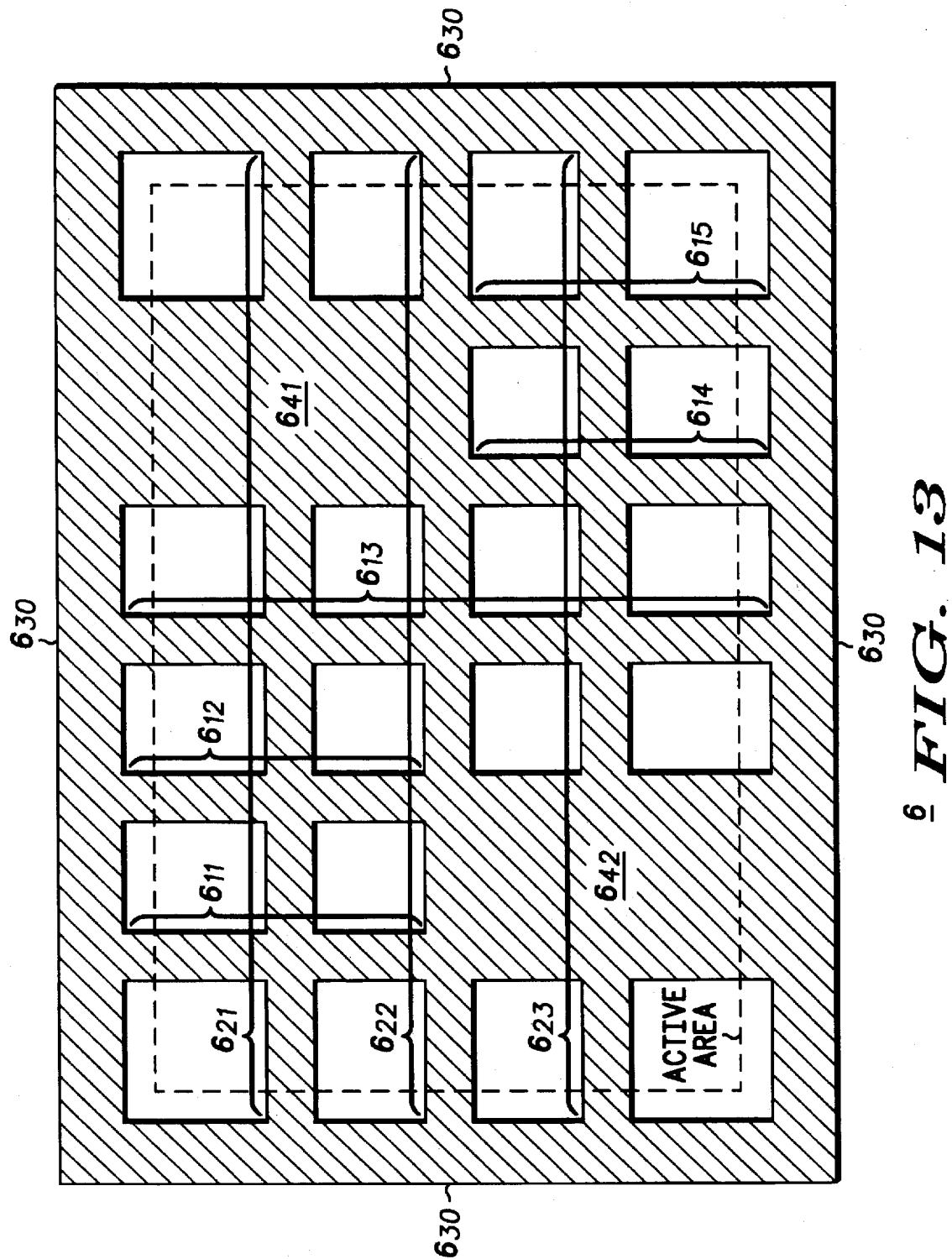
FIG. 13 is a partial perspective view depicting the shape of the gate in the MOS transistor of FIG. 9.
Figure 14:
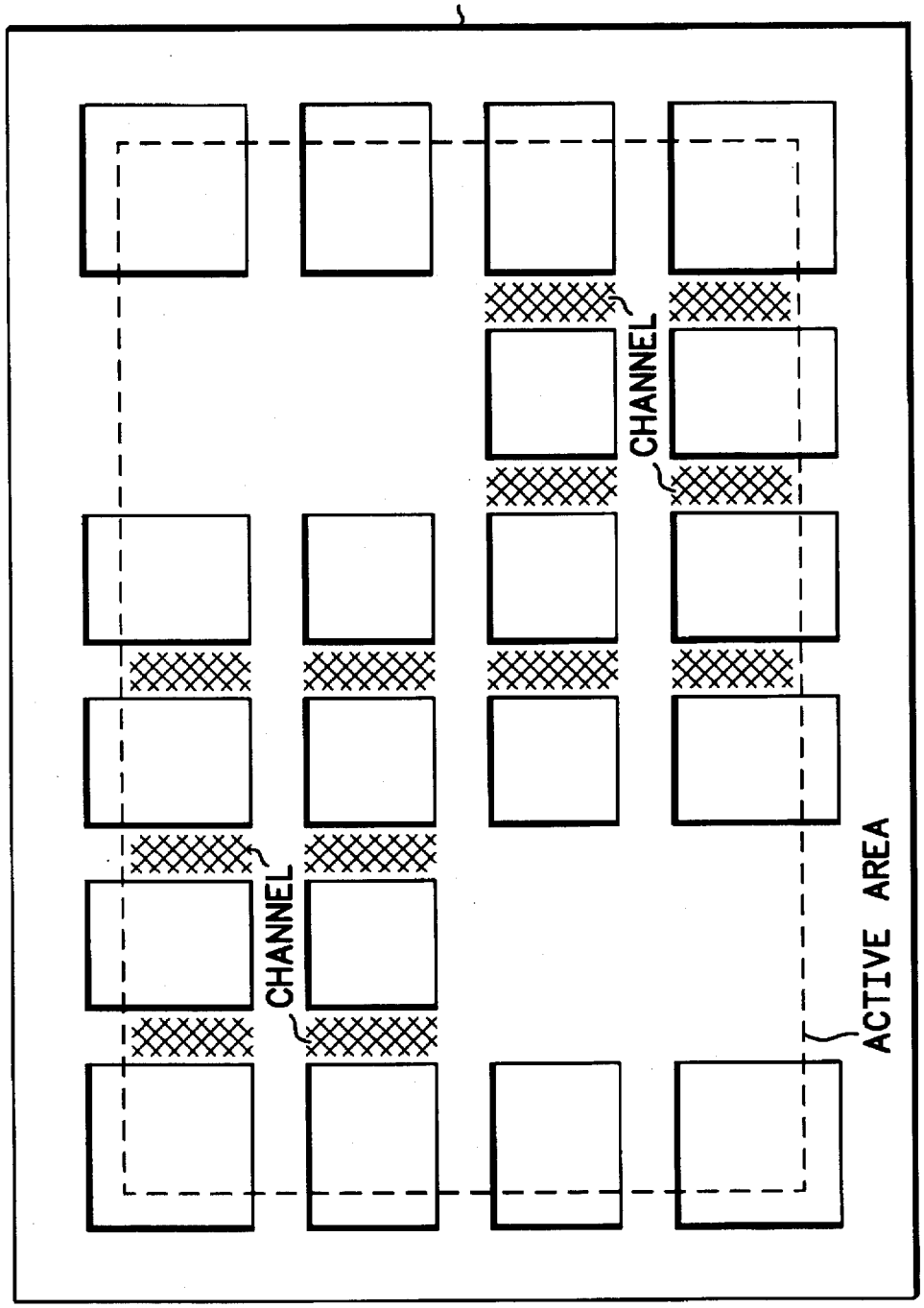
FIG. 14 is a partial perspective view depicting the channel formed in the MOS transistor of FIG. 9.

FIG. 9 is a plan perspective view depicting the structure of a MOS transistor according to another embodiment of the present invention; FIG. 10 is a cross-sectional view along 10—10 of FIG. 9; and FIG. 11 is a cross-sectional view along 11—11 of FIG. 9. FIGS. 12–14 are partial perspective views of FIG. 9.

In FIGS. 9–14, portions equal or equivalent to those shown in FIGS. 3–8 are denoted by the same reference symbols, and thus will not be described in detail. In this embodiment, except for some of the extending portions excluding the vertically extending portion $6_{13}$, the gate 6 has guides $6_{41}$ and $6_{42}$ for extending the conductor 11 to near the center of the gate plane thereof, as shown in FIG. 13. The guides $6_{41}$ and $6_{42}$ serve as the source side and drain side, respectively. As can be seen in FIG. 12, two sources and two drains are not formed under these guides. Thus, in the MOS transistor so configured, twelve channels are formed as shown in FIG. 14, so the number of transistor blocks used is reduced by 4, as compared to that shown in FIG. 8.

The conductor 11 extends from the surrounding portion $6_{30}$ to the horizontally extending portion $6_{22}$, as can be seen from FIG. 9. This allows the input signal from the terminal Gin to be propagated, with relatively little delay, to the gate near the conductor extending inward, so that the transistor blocks in which the channels are formed by that gate offer better response than the above-described embodiment. Thus, although the number of transistor blocks is reduced, the present embodiment allows the input signal to be propagated to the gate with a relatively uniform delay time over the entire transistor blocks formed on the semiconductor substrate 3. Additionally, it advantageously eliminates the need for changing the area of the entire semiconductor chip.

It should be appreciated that if the guides $6_{41}$ and $6_{42}$ are regarded as vertically extending portions in the present embodiment, the structure of this embodiment is equivalent or equal to the structure where the conductor 11 is laminated on some of the vertically extending portions of the grid-shaped gate 6. Furthermore, in the present embodiment, although the conductor 11 has been described as being extended vertically inward from the surrounding portion, it may be extended horizontally inward.

In the above alternative embodiment, it has been described that the propagation delay time of an input signal to each transistor block gate is equalized by disposing the conductor not only around the surrounding portion of the gate 6, but also into the inner extending portions. Below is described a method for efficiently equalizing the delay time.

Figure 15:
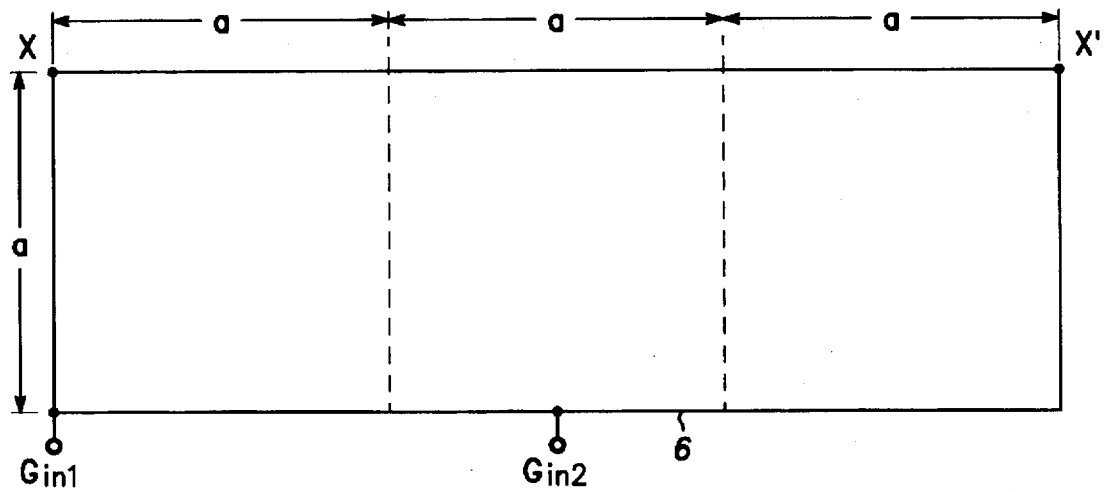
FIG. 15 is a schematic diagram for explaining a method for equalizing the delay time of a gate input signal (where neither the first nor second embodiment is applicable).

FIG. 15 is a schematic diagram depicting the grid-shaped polysilicon gate 6 as one plane, where the aspect ratio (vertical to horizontal ratio) of the gate is 1:3 and neither the first nor second embodiment is applicable.

In this case, the distance over which the gate signal input at $G_{IN1}$ is propagated to a point X' is given by:

[Equation 1]

$$\sqrt{\{(3a)^2+a^2\}} = \sqrt{10}a \qquad (1)$$

On the other hand, the distance over which the gate signal input at $G_{IN2}$ is propagated to a point X or X' is given by:

[Equation 2]

$$\sqrt{\{(a+a/2)^2+a^2\}} = \sqrt{(13/4)}a \qquad (2)$$

Figure 16:
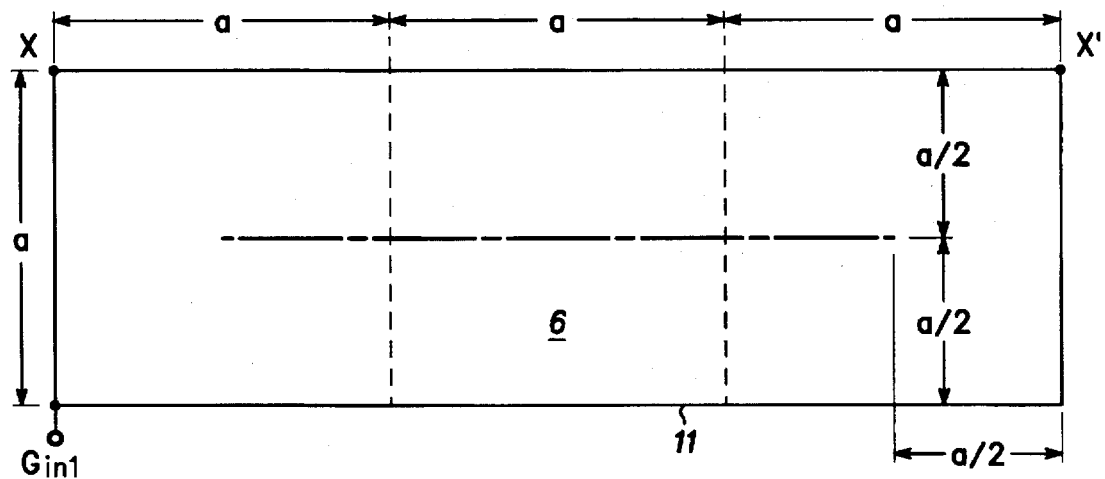
FIG. 16 is a schematic diagram for explaining a method for equalizing the delay time of a gate input signal (where the first embodiment is applicable).

A schematic diagram similar to FIG. 15 is shown in FIG. 16, where the above first embodiment is applicable.

In this case, because the conductor 11 is laminated on the surrounding portions of the gate 6 and in contact therewith, the propagation delay of the signal from $G_{IN1}$ to points X and X' may be ignored, as a rule.

The distance over which the gate signal input at $G_{IN1}$ is propagated to near the center of the gate 6 denoted by an alternate long and short dash line (i.e., the location farthest away from the conductor laminated on the gate surrounding portions) is given by:

[Equation 3]

$$a/2 \qquad (3)$$

Figure 17:
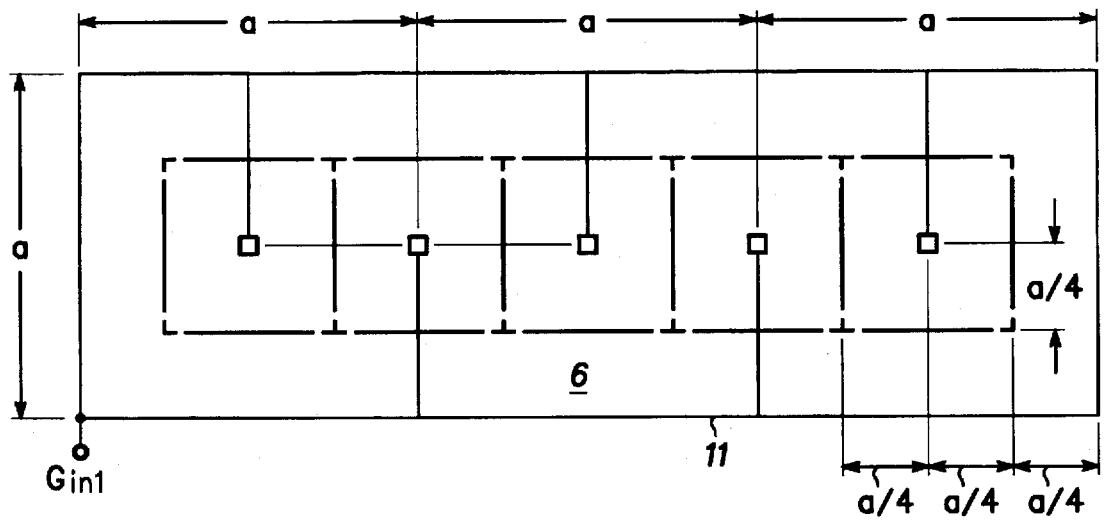
FIG. 17 is a schematic diagram for explaining a method for equalizing the delay time of a gate input signal (where the second embodiment is applicable).

Furthermore, a schematic diagram similar to FIGS. 15 and 16 is shown in FIG. 17, where the above second embodiment is applicable.

In this case, the conductor 11 is laminated on the surrounding portions of the gate 6, and leads from the conductor are extended inward to the gate 6 at five locations (indicated by □). That is, the conductor 11 is connected to the gate 6 not only in the surrounding portions but also at such locations.

In this case, the distance over which the gate signal input at $G_{IN1}$ is propagated to the location where the largest delay is involved (denoted by a alternate long and short dash line) is given by:

[Equation 4]

$$a/4 \qquad (4)$$

Thus, according to the results derived from FIGS. 15–17, it can be understood how much the delay time can be reduced by the first and second embodiments, as described below.

That is, the delay time in the case of FIG. 16 is increased by a factor of 0.15 as compared to Equation (1) for FIG. 15, and by a factor of 0.08 in the case of FIG. 17. The delay time in the case of FIG. 16 is increased by a factor of 0.28 as compared to Equation (2) for FIG. 15, and by a factor of 0.14 in the case of FIG. 17.

Through such trial calculations, any gate delay time can be set. For example, as compared to a switching time of 200 msec for the MOS transistor configured as in FIG. 15, this method permits a switching time of 20 nsec to be set accurately.

Figure 18:
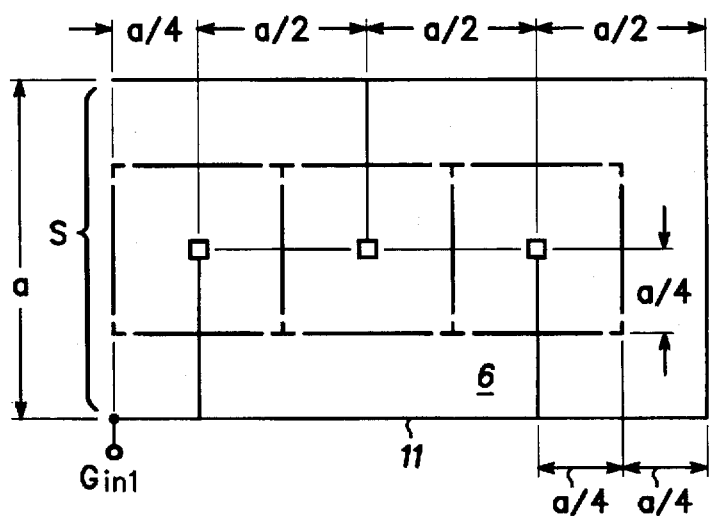
FIG. 18 is a schematic diagram for explaining a method for equalizing the delay time of a gate input signal (where the second embodiment is modified).

Although the structure having a conductive layer laminated in a pattern that completely surrounds the gate surrounding portions has been described, the present invention is not limited to such a pattern of conductive layer that is laminated on the gate. That is, in the above explanation, it has been described that the conductive layer laminated on the gate is comprised of a conductive surrounding portion extending along the perimeter of the distribution areas (generally denoted by active areas in FIGS. 3–14) of the gate, and the method described with reference to FIGS. 15–17 preferably equalizes the gate delay time, based on the assumption that the surrounding extending portion is comprised of four sides of a rectangle. However, the conductive surrounding extending portion may be comprised of three sides of a rectangle. Referring to FIG. 18, the conductor 11 extends from these three sides along the perimeter of the gate 6, and comprised of a connecting portion for connecting a middle point (denoted by □) located at or near the center of the distribution area with the conductive surrounding extending portion. Such a connecting portion assumes a shape of a straight line extending vertically from the conductive surrounding extending portion, and connects the middle points distributed at regular intervals of a/2 on the straight line segment (denoted by a dotted line) surrounded by and separated away by an equal distance of a/2 from the conductive surrounding extending portion, with the conductive surrounding extending portion. The distance between the middle points is equal to the distance of a/2 between the middle point and the conductive surrounding extending portion. The distance between an end of the straight line segment near the remaining one side S where the conductor is absent in the gate surrounding portion and that side S is half the distance a/2 between the middle point and conductive surrounding portion, that is, a/4.

By employing such an arrangement of the conductor, the delay time can be equalized in a similar manner to that shown in FIG. 17. In addition, various types of conductor patterns on the gate are possible, and may be designed appropriately according to a desired switching time for the MOS transistor.

On the other hand, the reasons why a certain semiconductor, i.e., polysilicon, is used for the respective gates of the transistor blocks may be explained as follows, in comparison to the transistor blocks formed by gates made of aluminum (so-called metal gates).

The first reason is that polysilicon may be easily established on a gate-length layout.

Figure 1:
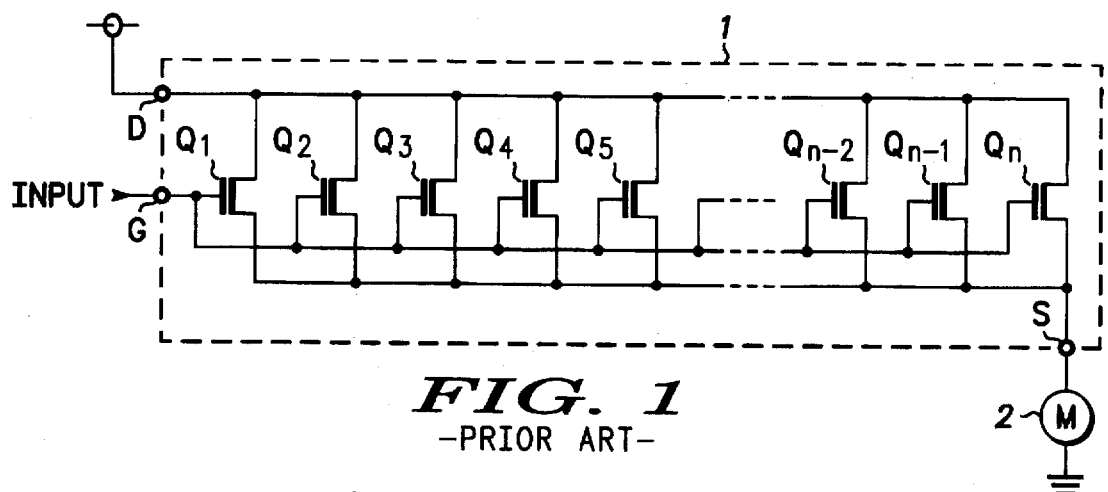
FIG. 1 is a circuit diagram depicting a prior art power IC where a plurality of MOS transistor blocks are connected together.
Figure 2:
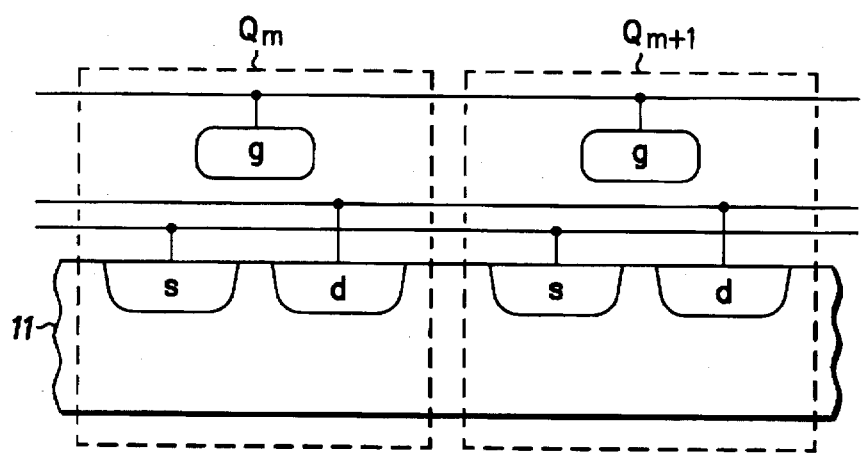
FIG. 2 is a schematic diagram depicting a wiring configuration for each electrode of the power IC of FIG. 1.
Figure 19:
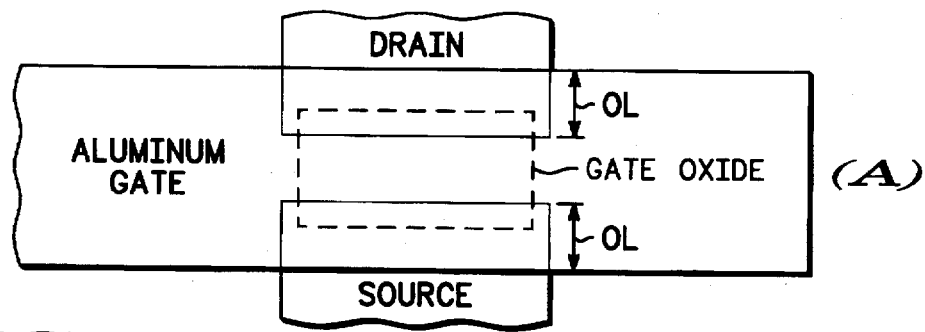
FIG. 19 is a plan view for explaining why polysilicon is used for each gate of each transistor block, depicting the structure of a metal gate transistor and a polysilicon gate transistor.
Figure 19:
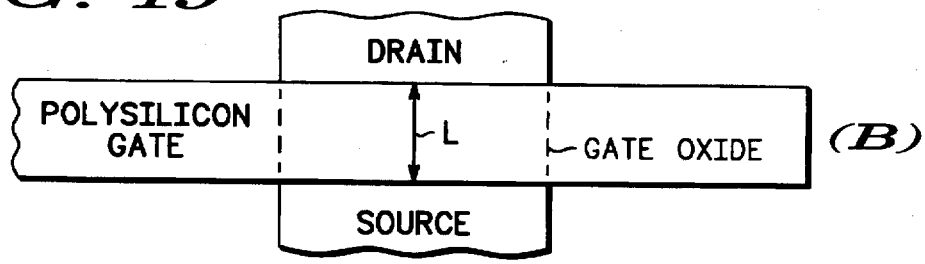

That is, in a transistor block of metal gate structure as shown in FIG. 19(A), a mask for forming a gate oxide film is required, so that unless some consideration is given to the overlap (OL) between the source and drain regions and the aluminum gate, the overlap may become non-existent due to mask misalignment, resulting in improper operation. In addition, the overlap itself assumes a capacitive load, which causes unstable operation of the transistor block. In contrast, in a transistor block of polysilicon structure as shown in FIG. 19(B), a mask for forming a gate oxide film is not necessary; after the formation of the polysilicon gate, that gate itself may be used as a mask to perform a self-aligned ion implantation, thereby forming the source and drain. Thus, a channel proportional to the length L of the polysilicon gate is formed, and because the capacitive load due to an overlap between the source and drain regions and the polysilicon gate is determined solely by lateral diffusion in the source and drain, thus eliminating the need for consideration given to the overlap.

The second reason is that polysilicon is suitable for a high-temperature process for forming sources and drains.

That is, it is necessary to expose source and drain layers to a high temperature of 900–950 degrees Celsius during such a high-temperature process; because aluminum has a melting point of about 400 degrees Celsius, an aluminum gate cannot serve as a self-alignment mask as shown in FIG. 19(B), so that sources and drains cannot be formed after laminating the aluminum gate. That is, during a high-temperature process where sources and drains are formed at temperatures exceeding the melting point of aluminum, it is necessary to form the sources and drains before lamination of the aluminum gate. In contrast, because polysilicon has a melting point of 1300 degrees Celsius, it can sufficiently withstand such a self-aligned high-temperature process.

In each of the above embodiments, although the semiconductor substrate 1 has been described as p-type silicon, it is not limited thereto, but may be of n-type and other semiconductors. In addition, sources and drains, as well as conductors, oxide films, and insulating films may be formed of various kinds of material and in various shapes. The number of transistors has been shown in the embodiments by way of example only, so it may be, of course, greater or smaller than that number. In each of the above embodiments, sources and drains have been arranged vertically and horizontally in an orderly fashion, it is not limited thereto, but the present invention may be applicable regardless of the vertical or horizontal direction, if the gates commonly formed (or formed of a continuous semiconductor layer) are disposed between the sources and drains via the gate oxide film (or insulator).

Thus, the present invention may be modified appropriately within the scope that can be implemented by those skilled in the art in accordance with the description herein.

As described above in detail, according to the MOS transistor of the present invention, an input signal to a gate of each transistor block is propagated with relatively little delay by a conductive layer laminated on the gate made of a continuous semiconductor layer, so that the delay times of an input signal to the respective gates can be equalized.

By extending the conductor laminated thereon to near the center of the principal plane of the gate, the delay time of a gate input signal to the transistor block located at the center of the semiconductor chip can be substantially reduced. Additionally, the larger the chip area of the MOS transistor, the better the inherent benefit of the present invention.

Furthermore, the present invention improves the switching speed associated with the output of a motor drive current having a heavy load of 1A, even when a power IC having a transistor block with a gate width of 10,000 μm or wider is employed.

What is claimed is:

1. A MOS transistor including a plurality of transistor blocks formed by sources which are connected to each other by a first electric conductive layer, drains which are connected to each other by a second electric conductive layer, and gates made of a continuous semiconductor layer, the improvement comprising:

the first electric conductive layer comprising an aluminum alloy;

the second electric conductive layer comprising an aluminum alloy;

a third electric conductive layer comprising an aluminum alloy which is connected to a gate terminal and laminated on said gates, wherein the third electric conductive layer comprises a surrounding extending portion that extends along a surrounding portion of a distribution area of said gates, and a connecting portion that connects a middle point located at or near the center of the distribution area with said surrounding extending portion; and the continuous semiconductor layer comprising polysilicon.

2. A MOS transistor according to claim 1, wherein said surrounding extending portion is comprised of at least three sides of a rectangle, and wherein said connecting portion is of straight-line shape extending vertically from said surrounding portion.

3. A MOS transistor according to claim 1, wherein said connecting portion connects middle points that are surrounded by said surrounding extending portion and are distributed at an equal distance on a straight line equally away therefrom.

4. A MOS transistor according to claim 2, wherein said connecting portion connects middle points that are surrounded by said surrounding extending portion and are distributed at an equal distance on a straight line equally away therefrom.

5. A MOS transistor according to claim 3, wherein the distance between said middle points is equal to a distance between said middle point and said surrounding extending portion.

6. A MOS transistor according to claim 2, wherein said surrounding extending portion is comprised of four sides of a rectangle.

7. A MOS transistor according to claim 3, wherein said surrounding extending portion is comprised of four sides of a rectangle.

8. A MOS transistor according to claim 5, wherein said surrounding extending portion is comprised of four sides of a rectangle.

9. A MOS transistor according to claim 2, wherein said surrounding extending portion is comprised of three sides of a rectangle, and wherein the distance from an end of said straight line near the remaining one side where said surrounding extending portion is absent to said remaining one side is half the distance from said three sides to said surrounding portion.

10. A MOS transistor according to claim 3, wherein said surrounding extending portion is comprised of three sides of a rectangle, and wherein the distance from an end of said straight line near the remaining one side where said surrounding extending portion is absent to said remaining one side is half the distance from said three sides to said surrounding portion.

11. A MOS transistor according to claim 5, wherein said surrounding extending portion is comprised of three sides of a rectangle, and wherein the distance from an end of said straight line near the remaining one side where said surrounding extending portion is absent to said remaining one side is half the distance from said three sides to said surrounding portion.

12. A MOS transistor according to claim 1, wherein said gates are formed in a grid, such that they extend vertically and horizontally along a principal plane of a semiconductor substrate.

13. A MOS transistor according to claim 12, wherein said sources and drains are formed in each of diffusion areas separated by a vertically extending portion in said gates.

14. A MOS transistor according to claim 13, wherein said vertically extending portion in said gates is disposed between said source and drain.

15. A MOS transistor according to claim 13, wherein said first and second electric conductive layers each have one-direction connecting portions for connecting the source and drain formed in said diffusion area, and other-direction connecting portions for connecting, between said one-direction connecting portions, the sources to each other and connecting the drains to each other, and wherein said one-direction connecting portions and said third electric conductive layer are formed with a single-layer wiring process step.

16. A MOS transistor according to claim 12, wherein said sources and drains are formed in each of diffusion areas separated by a horizontally extending portion in said gates.

17. A MOS transistor according to claim 16, wherein said horizontally extending portion in said gates is disposed between said source and drain.

18. A MOS transistor according to claim 16, wherein said first and second electric conductive layers each have one-direction connecting portions for connecting the source and drain formed in said diffusion area, and other-direction connecting portions for connecting, between said one-direction connecting portions, the sources to each other and connecting the drains to each other, and wherein said one-direction connecting portions and said third electric conductive layer are formed with a single-layer wiring process step.

19. A MOS transistor including a plurality of transistor blocks formed by sources which are connected to each other by a first conductive layer, drains which are connected to each other by a second conductive layer, and gates made of a continuous semiconductor layer, wherein:

the first conductive layer comprises an aluminum alloy;

the second conductive layer comprises an aluminum alloy; and the gates are formed in a grid pattern, such that they extend vertically and horizontally along a principal plane of a semiconductor substrate;

the MOS transistor further comprising:

a third conductive layer comprising an aluminum alloy connected to a gate terminal and laminated on a portion of said gates, wherein the third conductive layer comprises a surrounding portion that extends along at least a portion of a perimeter of the grid pattern formed by the gates.

20. A MOS transistor according to claim 19 wherein the third conductive layer further comprises a connecting portion that connects a point within the grid pattern formed by the gates with the surrounding portion.

* * * * *